US012663470B2

(12) United States Patent
Somani et al.

(10) Patent No.: US 12,663,470 B2
(45) Date of Patent: Jun. 23, 2026

(54) ACTIVE WRAP AROUND CIRCUIT FOR MUTUALLY COUPLES COILS

(71) Applicant: Hamilton Sundstrand Corporation, Charlotte, NC (US)

(72) Inventors: Vaibhav Kumar Somani, Bangalore (IN); William E. Villano, Canton, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 434 days.

(21) Appl. No.: 18/110,255

(22) Filed: Feb. 15, 2023

(65) Prior Publication Data

US 2023/0258722 A1     Aug. 17, 2023

(30) Foreign Application Priority Data

Feb. 15, 2022     (IN) .............................. 202241007845

(51) Int. Cl.
G01R 31/327     (2006.01)
G01R 19/165     (2006.01)
H03K 17/56     (2006.01)
(52) U.S. Cl.
CPC ..... G01R 31/327 (2013.01); G01R 19/16523 (2013.01); G01R 19/16576 (2013.01); H03K 17/56 (2013.01)
(58) Field of Classification Search
None
See application file for complete search history.

(56) References Cited

U.S. PATENT DOCUMENTS

| | | | |
|---|---|---|---|
| 5,517,515 A | 5/1996 | Spall et al. | |
| 7,928,847 B2 | 4/2011 | Murdoch et al. | |
| 8,081,001 B2 | 12/2011 | Hooper et al. | |
| 9,778,310 B2 * | 10/2017 | Schliebe ............... | G01R 31/72 |
| 10,062,535 B2 | 8/2018 | Simonin | |
| 10,928,446 B2 | 2/2021 | Krishna et al. | |
| 2004/0207371 A1 * | 10/2004 | Elek .................... | H02M 1/4216 |
| | | | 323/237 |
| 2006/0012374 A1 * | 1/2006 | Kojovic ............... | G01R 31/085 |
| | | | 324/522 |
| 2009/0316323 A1 * | 12/2009 | Knopf .................. | H01H 47/226 |
| | | | 361/156 |

(Continued)

FOREIGN PATENT DOCUMENTS

| | | |
|---|---|---|
| JP | 2018074753 A | 5/2018 |
| WO | 2018171244 A1 | 9/2018 |

OTHER PUBLICATIONS

Extended European Search Report, of the European Patent Office, dated Jul. 20, 2023, in corresponding European Patent Application No. 23156889.0.

(Continued)

*Primary Examiner* — Nasima Monsur

(57) ABSTRACT

A circuit can include a voltage input and a first inductor coil of a first channel configured to interface with a second inductor coil of a second channel to induce voltage to a winding (e.g. a solenoid) via the first channel or the second channel. At least a first wraparound circuit of the first channel can be operatively connected to the first inductor coil to prevent interference from the second inductor coil from activating a wraparound circuit operatively connected to the first inductor coil.

13 Claims, 1 Drawing Sheet

Channel 1

Channel 2

(56)              References Cited

U.S. PATENT DOCUMENTS

2016/0048183 A1 *   2/2016  Breen ........................ G06F 1/26
                                                  713/300
2021/0296885 A1     9/2021  Vanevenhoven et al.

OTHER PUBLICATIONS

Communication under Rule 71(3) EPC dated Jul. 7, 2025 in connection with European Patent Application No. 23156889.0, 31 pages.

* cited by examiner

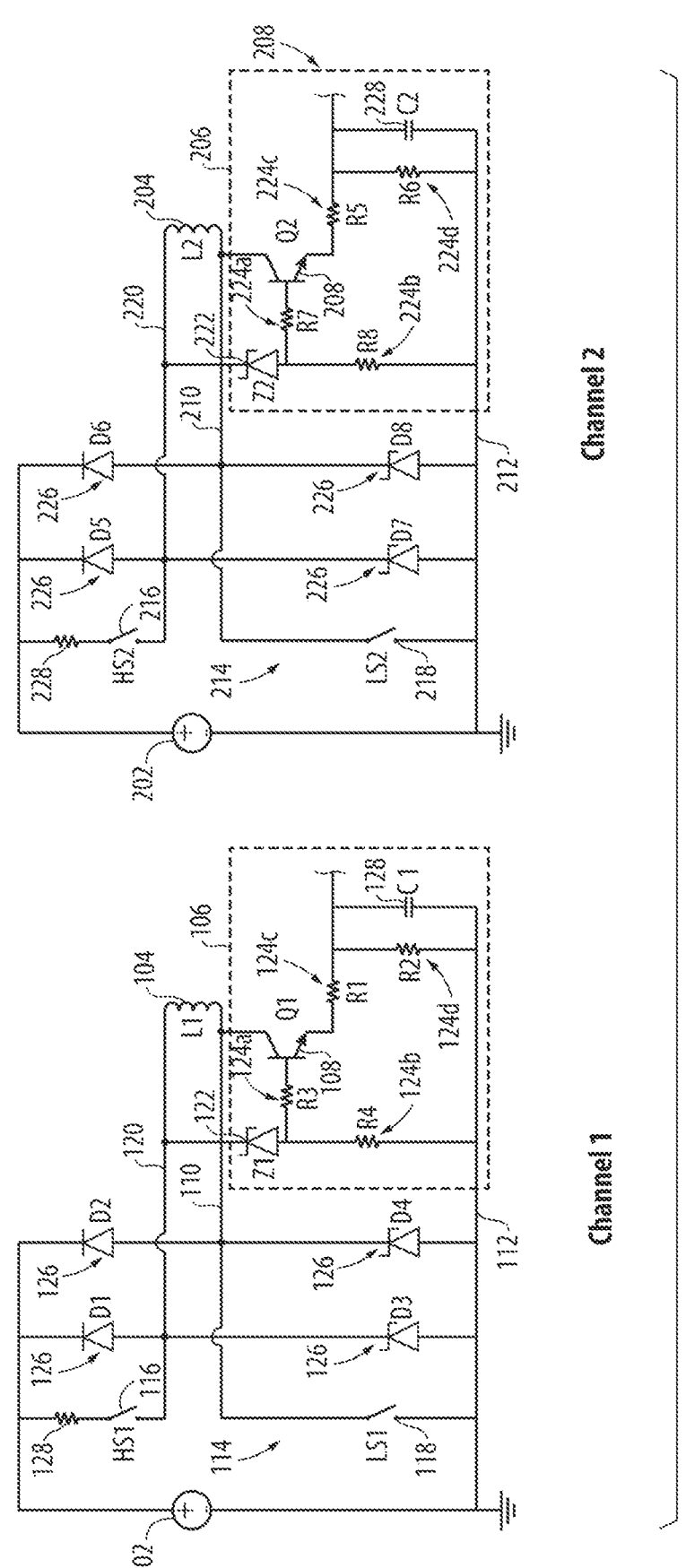

ACTIVE WRAP AROUND CIRCUIT FOR MUTUALLY COUPLES COILS

CROSS-REFERENCE TO RELATED APPLICATIONS

This application claims priority to and the benefit of Indian Provisional Patent Application No. 202241007845, filed Feb. 15, 2022, the entire content of which is incorporated herein by reference.

TECHNICAL FIELD

The present disclosure relates to wrap around circuits, and more particularly to wrap around circuits for mutually coupled inductor coils.

BACKGROUND

In multi-channel systems, having mutually coupled coils, the channel not driving its coil needs to perform a test of the circuit to check whether that there are any latent faults that will prevent the channel from taking over of the system, if called upon. In certain examples, coils may be tightly coupled through magnetic circuits, and one active coil may affect the other inactive coil. Such interference can cause a false failure signal in existing failure detection systems.

There is a need in the art for an active wrap around circuit that provides for failure detection, but is less susceptible to interference from the active coil to the inactive coil. This disclosure provides a solution for this need.

SUMMARY

In accordance with at least one aspect of this disclosure, a circuit includes voltage input, a first inductor coil of a first channel configured to interface a second inductor coil of a second channel to induce voltage from the voltage input to a winding via the first channel or the second channel, and a wraparound circuit of the first channel operatively connected to the first inductor coil. The wraparound circuit can include, a transistor operatively connected to a first rail of the first inductor coil configured to determine if a fault has occurred in the either of the first channel or the second channel, and if a fault has occurred, shunt short circuit current in the first inductor coil through the wraparound circuit to a ground reference of the wraparound circuit.

A switching module, including a high side switch operatively connected to a second rail of the first inductor coil and a low side switch operatively connected to the first rail of the first inductor coil, can be configured to provide excitation voltage to the first inductor coil. In embodiments, the transistor can be configured to operate in a congruent state with the high side switch when a voltage of the first wrap around circuit exceeds a predetermined failure threshold voltage.

In embodiments, the wraparound circuit can include, a zener diode operatively connected between the second rail of the first inductor coil and the transistor configured to block voltage above a predetermined threshold voltage to prevent forward bias of the transistor induced by counter-electromotive force of the second inductor coil. The predetermined threshold voltage of the zener diode can be greater than a counter-electromotive force in the first inductor coil due to excitation of the second inductor coil.

In embodiments, the wraparound circuit can include one or more resistors operatively connected between the first rail of the first inductor coil and the transistor configured to regulate a current gain upstream of the transistor. A first resistor of the one or more resistors can be disposed between the zener diode and the transistor and a second resistor of the one or more resistors can be disposed between the zener diode and a ground reference of the wraparound circuit. In embodiments, the first resistor and the second resistor can be configured to bias the first transistor of the first wraparound circuit.

In certain embodiments, the wraparound circuit can be a first wraparound circuit, wherein the transistor is a first transistor, and wherein the zener diode is a first zener diode. In certain such embodiments, the circuit can further include, the second inductor coil of the second channel interfaced with the first inductor coil, and a second wraparound circuit of the second channel operatively connected to the second inductor coil.

The second wrap around circuit can include a second transistor operatively connected to a first rail of the second inductor coil configured to determine if a fault has occurred in the either of the first channel or the second channel, and if a fault has occurred, shunt short circuit current in the second inductor coil through the second wraparound circuit to a ground reference of the second wraparound circuit. A second zener diode can be operatively connected between the second rail of the second inductor coil and the second transistor configured to block voltage above a predetermined threshold voltage to prevent forward bias of the second transistor induced by counter-electromotive force of the first channel.

One or more resistors can be operatively connected between the first rail of the second inductor coil and the second transistor configured to regulate a current gain upstream of the second transistor. A first resistor of the one or more resistors can be disposed between the zener diode and the second transistor, and a second resistor of the one or more resistors can be disposed between the zener diode and a ground reference of the second wraparound circuit. The first resistor and the second resistor can be configured to bias the second transistor of the second wraparound circuit.

In embodiments, the switching module can be a first switching module, and a second switching module, including a high side switch operatively connected to the second rail of the second inductor coil and a low side switch operatively connected to a first rail of the second inductor coil, can be configured to provide excitation voltage to the second inductor coil. In embodiments, the second transistor is configured to operate in a congruent state with the high side switch when a voltage of the second wraparound circuit exceeds a predetermined failure threshold voltage.

In certain embodiments, the low side switch of the first switching module and the low side switch of the second switching module can be configured for pulse width modulation control of current in the first inductor coil and the second inductor coil, respectively when the first inductor coil and the second inductor coil are active. In embodiments, one or more diodes can be operatively connected between the switching module and the first wraparound circuit configured to control flow of current between the switching module, the first inductor coil, and the first wraparound circuit. In embodiments, the first wraparound circuit and/or the second wraparound circuit can also include a capacitor operatively connected between the respective transistor and a ground reference of the respective wraparound circuit.

In accordance with at least one aspect of this disclosure, a method can include testing an inactive switching module of an inactive inductor coil while power is supplied to an active switching module of an active inductor coil mutually coupled with the inactive inductor coil, and preventing interference from the active inductor coil from activating a wraparound circuit operatively connected to the inactive inductor coil.

In embodiments, testing the inactive switching module can include checking a state of a high side switch of the inactive switching module, and if either of the high side switch or a low side switch is on, the method can include, shunting current from the inactive inductor coil through the wraparound circuit to a ground reference of the wraparound circuit if the voltage of the wraparound circuit exceeds a predetermined failure threshold voltage. In embodiments, preventing interference can include, blocking, with a zener diode, counter-electromotive force from reaching the inactive switching module of the inactive inductor coil due to excitation of the active inductor coil.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

FIG. 1 is a schematic circuit diagram in accordance with this disclosure, showing an active wraparound circuit for a dual channel system.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are described herein.

In accordance with at least one aspect of this disclosure, a circuit 100 can include a voltage input 102, 202 and a first inductor coil 104 of a first channel configured to interface a second inductor coil 204 of a second channel to induce a voltage in a winding (e.g. in a solenoid) via the first channel or the second channel. A low side wraparound circuit 106 of the first channel can be operatively connected to the first inductor coil 104.

In embodiments, the wraparound circuit 106 can include, a transistor 108 operatively connected to a first rail 110 of the first inductor coil 104, configured to determine if a fault has occurred in the either of the first channel or the second channel. If a fault has occurred, the transistor 108 can be configured to shunt short circuit current in the first inductor coil 104 through the wraparound circuit 108 to a ground reference 112 of the wraparound circuit.

A switching module 114 can include a high side switch 116 operatively connected to the a second rail 120 of the first inductor coil 104 and a low side switch 118 operatively connected to the first rail 110 of the first inductor coil 104. When the channel is active, for example the first channel, the switching module 114 can be configured to provide excitation voltage to the first inductor coil 104, by placing the high side switch 116 in the ON state (e.g., closed), and modulating the low side switch 118 as needed. In embodiments, the transistor 108 is configured to operate in a congruent state with the high side switch 116 when a voltage of the first wraparound circuit 106 exceeds a predetermined failure threshold voltage.

In embodiments, the wraparound circuit 106 can include a zener diode 122 operatively connected between the first rail 110 of the first inductor coil 104 and the transistor 108 configured to block voltage above a predetermined threshold voltage, to prevent forward bias of the transistor 108 by induced a counter-electromotive force ("back EMF") from by the second inductor coil 204. The predetermined threshold voltage of the zener diode 122 can be greater than back EMF felt in the first inductor coil 104 due to excitation of the second inductor coil 204. For example, the predetermined threshold voltage can be half of the voltage from the voltage input 102 (Vdc/2). Vdc/2 can be a good approximation for the zener diode 122 threshold selection, when both coils have an equal number of turns, because voltage will be proportional to inductance of the first and second inductor coils 104, 204. In embodiments, the zener diode 122 threshold can be selected to ensure any back voltage from the active inductor coil will not cross to the switching module 114 of the inactive inductor coil, as needed for a given system or application.

In embodiments, the wraparound circuit 106 can include one or more resistors 124 operatively connected between the first rail 110 of the first inductor coil 104 and the transistor 108 configured to regulate a current gain upstream of the transistor 108. A first resistor 124a can be disposed between the zener diode 122 and the transistor 108 and a second resistor 124b can be disposed between the zener diode 122 and the ground reference 112 of the wraparound circuit 106. In embodiments, the first resistor 124a and the second resistor 124b can be configured to bias a first transistor 108 of a first wraparound circuit 106 of the first channel.

The circuit also includes the second inductor coil 204 of the second channel interfaced with the first inductor coil 104. The second wraparound circuit 206 of the second channel can be operatively connected to the second inductor coil 204.

The second wraparound circuit 206 can be the same or similar to the first wraparound circuit 106. Specifically, the second wraparound circuit 206 can include the second transistor 208 operatively connected to a first rail 210 of the second inductor coil 204 configured to determine if a fault has occurred in the either of the first channel or the second channel. If a fault has occurred such that the high side switch 216 of the second channel fails short or in the "ON" state, the second transistor 208 will shunt current from the second inductor coil 204 through the second wraparound circuit 206 to a ground reference 212 of the second wraparound circuit 206. A zener diode 222 can be operatively connected between the second rail 220 of the second inductor coil 204 and the second transistor 208, the zener diode 222 configured to block voltage above a predetermined threshold voltage to prevent forward bias of the second transistor 208 by the first channel.

One or more resistors 224 can be operatively connected between the first rail 210 of the second inductor coil 204 and the second transistor 208 configured to regulate a current gain upstream of the second transistor 208. Like the first wraparound circuit 106, a first resistor 224a can be disposed between the zener diode 222 and the second transistor 208, and a second resistor 224b can be disposed between the zener diode 222 and the ground reference 212 of the second wraparound circuit 206, such that the first resistor 224*a* and the second resistor 224*b* are configured to bias the second transistor 208 of the second wraparound circuit 206 of the second channel.

A second switching module 214 can be included for the second channel, where the second switching module 214 includes a high side switch 216 operatively connected to the second rail 220 of the second inductor coil 204 and a low side switch 218 operatively connected to the first rail 210 of the second inductor coil 204. The second switching module 214 can be configured to provide excitation voltage to the second inductor coil 204. The second transistor 208 can be configured to operate in a congruent state with the high side switch 216 when a voltage of the second wraparound 206 circuit exceeds a predetermined failure threshold voltage.

In embodiments, the low side switch 118 of the first switching module 114 and the low side switch 218 of the second switching module 214 can be configured for pulse width modulation control of current in the first inductor coil 104 and the second inductor coil 204, respectively, when the first inductor coil 104 and the second inductor coil 204 are in their respective active states.

In embodiments, one or more diodes 126, 226 can be operatively connected between the switching module 114, 214 and the wraparound circuit 106, 206 configured to control flow of voltage between the switching module 114, 214, the inductor coil 104, 204, and the wraparound circuit 106, 206. In certain embodiments, the one or more diodes 126, 226 can include electrostatic discharge protection diodes. It is contemplated however, the circuit 100 can operate as described herein without the inclusion of diodes 126, 226 in either of the first and/or second channel.

In embodiments, at least one of the first wraparound circuit 106 and/or the second wraparound circuit 206 can further include a capacitor 128, 228 operatively connected between the transistor 108, 208 and the ground reference 112, 212 of the wraparound circuit 106, 206. In operation, one channel will be active at a given time, while the other is inactive. In this case, the circuit 100 as disclosed herein provides the inactive inductor coil protection from interference by the active inductor coil. In this way, the first wraparound circuit 106, and the second wraparound circuit 206 can be configured to function in similar, or the same manner, but at different times, corresponding to the activity status of its corresponding channel and inductor coil.

In accordance with at least one aspect of this disclosure, a method can include testing an inactive switching module (e.g., either of switching module 114, 214) of an inactive inductor coil (e.g., coils 104, 204) while power is supplied to an active switching module of an active inductor coil mutually coupled with the inactive inductor coil, and preventing interference from the active inductor coil from activating a wraparound circuit (e.g., either of circuits 106, 206) operatively connected to the inactive inductor coil.

In embodiments, testing the inactive switching module can include checking a state of a high side switch (e.g., either of switches 116, 216) of the inactive switching module, if either of the high side switch or a low side switch (e.g., either of switches 118, 218) is on, the method can include shunting (e.g., by activating the respective transistor 108, 208 of the inactive channel) voltage from the inactive inductor coil through the wraparound circuit to a ground reference of the wraparound circuit if the voltage of the first wraparound circuit exceeds a predetermined failure thresh-old voltage. In embodiments, preventing interference can include blocking, with a zener diode (e.g., either of diodes

122, 222), back EMF from reaching the inactive switching module of the inactive inductor coil due to excitation of the active inductor coil.

Embodiments disclosed herein relate to a circuit 100 which interfaces with mutually-coupled inductor coils 104, 204, for example in solenoids, relays, or torque motors. In certain embodiments, this could involve a dual-channel system (e.g., as shown) that interfaces with dual-wound solenoids where only one channel at a time actively drives one of the windings. In such a system, the channel not driving its solenoid winding needs to perform a built-in test of the solenoid to determine whether there are any latent faults in the circuit that will prevent the channel from taking over solenoid control, if called upon.

In embodiments, both inductor coils 104, 204 are tightly coupled through magnetic circuits, where the active coil can affect the inactive coil. In certain instances, this effect can cause a false failure in a low side wrap around circuit of the inactive coil, during the aforementioned built-in test (BIT). While the examples disclosed herein relate to dual-wound inductive elements as examples, it is contemplated embodiments can also to apply to triplex-wound electromechanical devices.

In operation, as shown, a dual channel solenoid can be controlled independently by low side switches 118, 218 and high side switches 116, 216. One scenario of interest is when the current in the active coil (for the purposes of explanation, it is assumed the second coil 204 is the active coil), is controlled by high-side and low-side switches 216, 218 while the first coil 104, is kept idle. In this case, due to mutual inductance between the first and second coils 104, 204, the active coil 204 can present back EMF to the circuit 100, which can charge the low-side voltage wraparound circuit 114 undesirably. This back EMF can falsely indicate to the connected system that high-side switch 116, has failed (e.g., is stuck in an ON position). For example, while the low side switch 218 of the active channel is modulating current, both the low side 118 and high side 116 switches of the inactive coil 104 should see no current, because the switches 118, 116 are in the OFF state (e.g., open). However, residual current may be moving across the protection diodes 126 and the inactive channel, such that a voltage will present across the capacitor 228 in the active channel. This voltage may indicate that the high side switch 116 of the inactive coil 104 is failed short (e.g., stuck in the ON state).

Embodiments include a circuit 100 which can prevent modulation of one coil's current from triggering a false failure on other idle coil's low side wrap around circuit 106, 206. Embodiments provide for detection of high-side switch failing short and detection of a short between the first and second coil in the mutually coupled coils. Embodiments can also include a shunt resistor 128, 228, where the described circuit allows the shunt resistor to sense the complete coil current without any distortion.

Embodiments can include an active low-side voltage wraparound circuit 106, 206 for each coil of each channel. Referring to FIG. 1, in operation, the channel 1 circuit is assumed to be the standby channel that is not actively modulating current at the given time. The channel 1 circuit, in particular the components in the wraparound portion 106 of the circuit only allow for activation of the transistor 108 when the high side switch 116 is closed (or failed short). This can be achieved by choosing a threshold for the zener diode 122 at a critical voltage such that at only voltage greater than an input voltage (at a minimum) such that the zener diode 122 will experience an avalanche breakdown and provide enough bias current to the first and second resistors 124a, 124b (and in embodiments, resistors 124c, 124d) of the wraparound circuit 106 of the inactive channel, ultimately forward biasing the transistor 108 of the inactive channel. In embodiments, the value of resistors 124, 224 can be selected such that transistor 108, 208 provides a desirable current gain to get a desirable voltage level at the ground reference 112 of the wrap around circuit 106 of the inactive channel. Until that threshold is reached, the low-side wraparound 106 will indicate no low-side voltage. It should be understood, the same or similar applies when the channel 1 coil is active, and the channel coils is kept idle.

In embodiments, the wraparound circuits 106, 206 can be configured and adapted such that an active coil's excitation will not trigger a false failure on another, inactive, coil coupled to the active coil. Specifically, the inactive wraparound circuit will not activate the transistor if the high side switch is not connected (e.g., not in an ON state). This also ensures that transistor will not get activated even if there is only a back EMF on the coil due to excitation of another mutually coupled coil. Because the back EMF will be pulsating positive and negative with a duty cycle that will cause an average voltage across coil less than VDC_In/2 (if the two coils have an identical number of windings), at this voltage the zener diode will not have enough current to bias the transistor of the inactive coil.

Embodiments include a means for detection of a short between high side point of both coils. In this case it is assumed that one coil's excitation circuit is active i.e. the high-side switch is kept ON and low side switch is controlled with a pulse width modulation of fixed duty cycle to produce a desirable current in the active coil. The other excitation circuit (e.g., of the inactive channel) is not active, so both the high side and low side switches should be in the OFF state. If there is a short between the high side point of both coils, the inactive coil's high-side point will also see a voltage equal to input voltage (VDC_IN) through the path of closed switch high side switch and the short between coils. This measured voltage will trigger the inactive coil's transistor to activate and wrap around a voltage higher than a failure threshold. In embodiments, this method can also be suitable for detecting a 28V short to the inactive coil's high side.

Embodiments include a means for detection of short between low side point of both coils. In this case, it is still assumed that one coil's excitation circuit is active, i.e. high side switch is kept 'ON' and low side switch is controlled with a PWM of fixed duty cycle to get a desirable current in the coil. The other excitation circuit (e.g., of the inactive channel) is not active, so both the high side and low side switches should be in the OFF state. Here, if there is a short between low side point of both coils, then inactive coil's high side point will also see a voltage equals to input voltage (VDC_IN) through the path of closed switch high side switch, the inactive coil, the short between both coils, and the active coil. This will make the inactive coil's transistor active and wrap around voltage higher than the failure threshold. In embodiments, this method can also be suitable for detecting a 28V short to the inactive coil's low side.

As described, embodiments address and prevent false failures (e.g., false positives of a failure) of low side wrap around circuit, by blocking back EMF from an active coil from reaching an inactive coil, where the active and inactive coils are another mutually coupled coils. As described, embodiments can detect three failure conditions: high side switch fails short, a short between high side point of both coils, and a short between a low side point of both coils.

Additionally, embodiments can be less susceptible to noise and mutual coupling effect due to other active circuits.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A circuit, comprising:
a voltage input;
a first inductor coil of a first channel configured to interface with a second inductor coil of a second channel to induce a voltage from the voltage input to a winding via the first channel or the second channel;
a first wraparound circuit of the first channel operatively connected to the first inductor coil, the first wraparound circuit including a first transistor operatively connected to a first rail of the first inductor coil, wherein the first transistor is configured, if a fault has occurred in either of the first channel or the second channel, to shunt short circuit current in the first inductor coil through the first wraparound circuit to a ground reference of the first wraparound circuit; and
a first switching module including a first high side switch operatively connected to a second rail of the first inductor coil and a first low side switch operatively connected to the first rail of the first inductor coil, the first switching module configured to provide excitation voltage to the first inductor coil.

2. The circuit of claim 1, wherein the first transistor is configured to operate in a state corresponding to a state of the first high side switch when a voltage of the first wraparound circuit exceeds a predetermined failure threshold voltage.

3. The circuit of claim 2, wherein the first wraparound circuit further includes a first Zener diode operatively connected between the first rail of the first inductor coil and the first transistor, the first Zener diode configured to block voltage above a predetermined threshold voltage to prevent forward bias of the first transistor induced by a counter-electromotive force of the second inductor coil.

4. The circuit of claim 3, wherein the predetermined threshold voltage of the first Zener diode is greater than a counter-electromotive force of the first inductor coil due to excitation of the second inductor coil.

5. The circuit of claim 3, wherein the first wraparound circuit further includes one or more first resistors operatively connected between the first rail of the first inductor coil and the first transistor, the one or more first resistors configured to regulate a current gain upstream of the first transistor.

6. The circuit of claim 5, wherein:
one of the one or more first resistors is disposed between the first Zener diode and a second transistor; and another of the one or more first resistors is disposed between the first Zener diode and the ground reference of the first wraparound circuit.

7. The circuit of claim 6, wherein the one or more first resistors are configured to bias the first transistor of the first wraparound circuit.

8. The circuit of claim 7, further comprising:
the second inductor coil of the second channel interfaced with the first inductor coil;
a second wraparound circuit of the second channel operatively connected to the second inductor coil, wherein the second wraparound circuit includes the second transistor operatively connected to a first rail of the second inductor coil, wherein the second transistor is configured, if the fault has occurred in either of the first channel or the second channel, to shunt short circuit current in the second inductor coil through the second wraparound circuit to a ground reference of the second wraparound circuit;
a second Zener diode operatively connected between a second rail of the second inductor coil and the second transistor, the second Zener diode configured to block voltage above a predetermined threshold voltage to prevent forward bias of the second transistor induced by a counter-electromotive force of the first channel; and
second resistors operatively connected between the first rail of the second inductor coil and the second transistor, the second resistors configured to regulate a current gain upstream of the second transistor, wherein one of the second resistors is disposed between the second Zener diode and the second transistor, wherein another of the second resistors is disposed between the second Zener diode and the ground reference of the second wraparound circuit, and wherein the second resistors are configured to bias the second transistor of the second wraparound circuit.

9. The circuit of claim 8, further comprising:
a second switching module including a second high side switch operatively connected to the second rail of the second inductor coil and a second low side switch operatively connected to the first rail of the second inductor coil, the second switching module configured to provide excitation voltage to the second inductor coil.

10. The circuit of claim 9, wherein the second transistor is configured to operate in a state corresponding to a state of the second high side switch when a voltage of the second wraparound circuit exceeds a predetermined failure threshold voltage.

11. The circuit of claim 9, wherein the first low side switch of the first switching module and the second low side switch of the second switching module are configured for pulse width modulation control of current in the first inductor coil and the second inductor coil, respectively, when the first inductor coil and the second inductor coil are active.

12. The circuit of claim 2, further comprising one or more diodes operatively connected between the first switching module and the first wraparound circuit, the one or more diodes configured to control flow of current between the first switching module, the first inductor coil, and the first wraparound circuit.

13. The circuit of claim 12, wherein the first wraparound circuit further includes a capacitor operatively connected between the first transistor and the ground reference of the first wraparound circuit.

* * * * *